United States Patent
Casillas, Jr. et al.

(10) Patent No.: US 7,624,323 B2
(45) Date of Patent: Nov. 24, 2009

(54) METHOD AND APPARATUS FOR TESTING AN IC DEVICE BASED ON RELATIVE TIMING OF TEST SIGNALS

(75) Inventors: Sergio Casillas, Jr., Antelope, CA (US); Bruce LaVigne, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 443 days.

(21) Appl. No.: 11/590,047

(22) Filed: Oct. 31, 2006

(65) Prior Publication Data
US 2008/0104471 A1    May 1, 2008

(51) Int. Cl.
| G06F 11/00 | (2006.01) |
| G06K 5/04 | (2006.01) |
| G11B 5/00 | (2006.01) |
| G11B 20/20 | (2006.01) |
| H03M 13/00 | (2006.01) |
| G06F 17/50 | (2006.01) |
| G06F 9/45 | (2006.01) |
| G01D 18/00 | (2006.01) |
| G01D 21/00 | (2006.01) |
| G01M 19/00 | (2006.01) |
| G01P 21/00 | (2006.01) |
| G01R 35/00 | (2006.01) |
| G04F 1/00 | (2006.01) |
| G04F 3/00 | (2006.01) |
| G04F 5/00 | (2006.01) |
| G04F 7/00 | (2006.01) |
| G04F 8/00 | (2006.01) |
| G04F 10/00 | (2006.01) |
| G04G 5/00 | (2006.01) |
| G04G 7/00 | (2006.01) |
| G04G 15/00 | (2006.01) |

(52) U.S. Cl. .................. 714/738; 714/55; 714/700; 714/815; 702/89; 702/125; 702/176; 702/177; 716/6

(58) Field of Classification Search ............... None
See application file for complete search history.

(56) References Cited

U.S. PATENT DOCUMENTS

| 3,917,933 | A | * | 11/1975 | Scheuneman et al. | ....... 714/710 |
| 3,999,051 | A | * | 12/1976 | Petschauer | .................. 714/710 |
| 4,358,847 | A | * | 11/1982 | Susskind | ..................... 714/736 |
| 4,371,949 | A | * | 2/1983 | Chu et al. | ..................... 714/52 |
| 6,182,255 | B1 | * | 1/2001 | Ohtomo | ...................... 714/724 |
| 6,314,536 | B1 | * | 11/2001 | Kurosaki | ..................... 714/718 |
| 6,460,152 | B1 | * | 10/2002 | Demidov et al. | ............ 714/723 |
| 7,209,849 | B1 | * | 4/2007 | Watanabe et al. | ........... 702/108 |
| 7,216,271 | B2 | * | 5/2007 | Tanaka et al. | ................ 714/719 |
| 2007/0061097 | A1 | * | 3/2007 | Sato | ........................... 702/125 |

* cited by examiner

Primary Examiner—Kevin L Ellis
Assistant Examiner—Guerrier Merant

(57) ABSTRACT

An apparatus for testing an IC device includes a test signal generator for generating a predefined sequence of test signals that are input to the IC device. A timing skew monitor is provided for monitoring the test signals input in the IC device and a signal output from the IC device for a predetermined time period, and creating an array indicating an execution or a nonexecution of signal timing combinations of one of the test signals relative to at least one of the other test signals within the predetermined time period by the IC device. A determination as to whether the desired signal timing combinations of the test signals have been executed by the IC device is made by an operator.

18 Claims, 6 Drawing Sheets

B (Relative to A) — 20

| TIME | -4 | -3 | -2 | -1 | 0 | +1 | +2 | +3 | +4 |
|---|---|---|---|---|---|---|---|---|---|
| -4 | 1 | 1 | 1 | 1 | 1 | 1 | 1 | 0 | 0 |
| -3 | 1 | 1 | 1 | ①| 1 | 1 | 1 | 1 | 0 |
| -2 | 1 | 1 | 1 | 1 | 1 | 1 | 1 | 0 | 0 |
| -1 | 1 | 1 | 1 | 1 | 1 | 1 | 1 | 1 | 0 |
| 0 | 1 | 1 | 1 | 1 | 1 | 1 | 1 | 0 | 0 |
| 1 | 1 | 1 | 1 | 1 | 1 | 1 | 1 | 1 | 0 |
| 2 | 0 | 1 | 1 | ⓪ | 0 | 1 | 1 | 0 | 0 |
| 3 | 0 | 0 | 1 | 1 | 0 | 0 | 1 | 1 | ⓪ |
| 4 | 0 | 0 | 0 | 0 | 0 | 0 | 0 | 0 | 0 |

C (Relative to A)

Figure 3

B (Relative to A) — 22

| TIME | -4 | -3 | -2 | -1 | 0 | +1 | +2 | +3 | +4 |
|---|---|---|---|---|---|---|---|---|---|
| -4 | 0 | 0 | 0 | 0 | 0 | 0 | 0 | 0 | 0 |
| -3 | 0 | 0 | 0 | 0 | 0 | 0 | 0 | 0 | 0 |
| -2 | 0 | 0 | 0 | 0 | 0 | 0 | 0 | 0 | 0 |
| -1 | 0 | 0 | 0 | 0 | 0 | 0 | 0 | 0 | 0 |
| 0 | 0 | 0 | 0 | 0 | 0 | 0 | 0 | 0 | 0 |
| 1 | 0 | 0 | 0 | 0 | 0 | 0 | 0 | 0 | 0 |
| 2 | 0 | 0 | 0 | 0 | 0 | 0 | 0 | 0 | 0 |
| 3 | 0 | 0 | 0 | 0 | 0 | 0 | 0 | 0 | 0 |
| 4 | 0 | 0 | 0 | 0 | 0 | 0 | 0 | 0 | 0 |

D (Relative to A)

Figure 4

C (Relative to A) — 24

| TIME | -4 | -3 | -2 | -1 | 0 | +1 | +2 | +3 | +4 |
|---|---|---|---|---|---|---|---|---|---|
| -4 | 0 | 0 | 0 | 0 | 0 | 0 | 0 | 0 | 0 |
| -3 | 0 | 0 | 0 | 0 | 0 | 0 | 0 | 0 | 0 |
| -2 | 0 | 0 | 0 | 0 | 0 | 0 | 0 | 0 | 0 |
| -1 | 0 | 0 | 0 | 0 | 0 | 0 | 0 | 0 | 0 |
| 0 | 0 | 0 | 0 | 0 | 0 | 0 | 0 | 0 | 0 |
| 1 | 0 | 0 | 0 | 0 | 0 | 0 | 0 | 0 | 0 |
| 2 | 0 | 0 | 0 | 0 | 0 | 0 | 0 | 0 | 0 |
| 3 | 0 | 0 | 0 | 0 | 0 | 0 | 0 | 0 | 0 |
| 4 | 0 | 0 | 0 | 0 | 0 | 0 | 0 | 0 | 0 |

D (Relative to A)

Figure 5

| TIME | A | B | C | D |
|---|---|---|---|---|
| 0 | 0 | 0 | 0 | 0 |
| 1 | 0 | 0 | 1 | 0 |
| 2 | 0 | 1 | 0 | 0 |
| 3 | 0 | 1 | 1 | 0 |
| 4 | 1 | 0 | 0 | 0 |
| 5 | 1 | 0 | 1 | 0 |
| 6 | 1 | 1 | 0 | 0 |
| 7 | 1 | 1 | 1 | 0 |

METHOD AND APPARATUS FOR TESTING AN IC DEVICE BASED ON RELATIVE TIMING OF TEST SIGNALS

FIELD OF INVENTION

The present invention relates generally to testing of IC devices, and in particular to testing of an IC device based on monitoring of the timing of the test signals relative to each other.

BACKGROUND OF THE INVENTION

Testing an integrated circuit (IC) design may be split into two types: white box and black box. White box testing looks inside a design, and is able to check and/or force every internal node as a part of the testing process. In a complex ASIC design, this is not practical due to the immense search space. Black box testing, on the other hand, treats the internals of the design as an unknown and tests the design solely by driving the inputs and checking the outputs.

In black box testing, one concern is that the internal state of a design has not been exhaustively tested. For example, the external inputs to a sample device under test (DUT) 14 in FIG. 7 are A, B and C, the output signal of the DUT is D, and the internal state of the DUT is E, F, G, and H. One form of black box test might be to make sure that each of the eight combinations of inputs A, B, C to the block has been exercised. However, due to the internal state of the DUT 14, not all cases have truly been covered. The true search space includes the (unseen) internal state. Thus, there are actually 7 "inputs" (including E, F, G and H) to create output D, and exercising every combination would take at least 128 clocks. One might (erroneously) deduce from the simple 8 clock test, as shown in FIG. 8, that the output D never gets set to 1.

SUMMARY OF THE INVENTION

The present invention is directed to a method and apparatus for testing an IC device. One embodiment of the invention includes a test signal generator for generating a predefined sequence of test signals that are input to the IC device. A timing skew monitor is provided for monitoring the test signals input in the IC device and a signal output from the IC device for a predetermined time period, and creating an array indicating an execution or a nonexecution of signal combinations of one of the test signals relative to at least one of the other test signals within the predetermined time period by the IC device. A determination as to whether the desired signal timing combinations of the test signals have been executed by the IC device is made by an operator.

BRIEF DESCRIPTION OF THE DRAWINGS

FIGS. 3-5 are timing arrays that correspond to the monitored test signals of FIG. 2, and show the receipt of different combinations of two test signals relative to the time of receipt of another test signal;

DETAILED DESCRIPTION OF THE INVENTION

The present invention is based on the realization that the internal state of an integrated circuit (IC) device is affected by the timing of input signals. Any input arriving at any time may affect the internal state, and thus the output. However, in this particular extension of black box testing, each input signal is assumed to only affect the internal state in a set way, so it is not necessary to test every possible variety of timing, but rather, just a smaller set of skews between the receipt of signals. In one embodiment of the present invention, the test signals that are input to a device under test (DUT) and any signals that are output from the DUT are monitored to determine the time skew, i.e., the time difference in the receipt of these signals relative to each other. The results are formed in arrays or tables to be analyzed by the operator.

Figure 1:
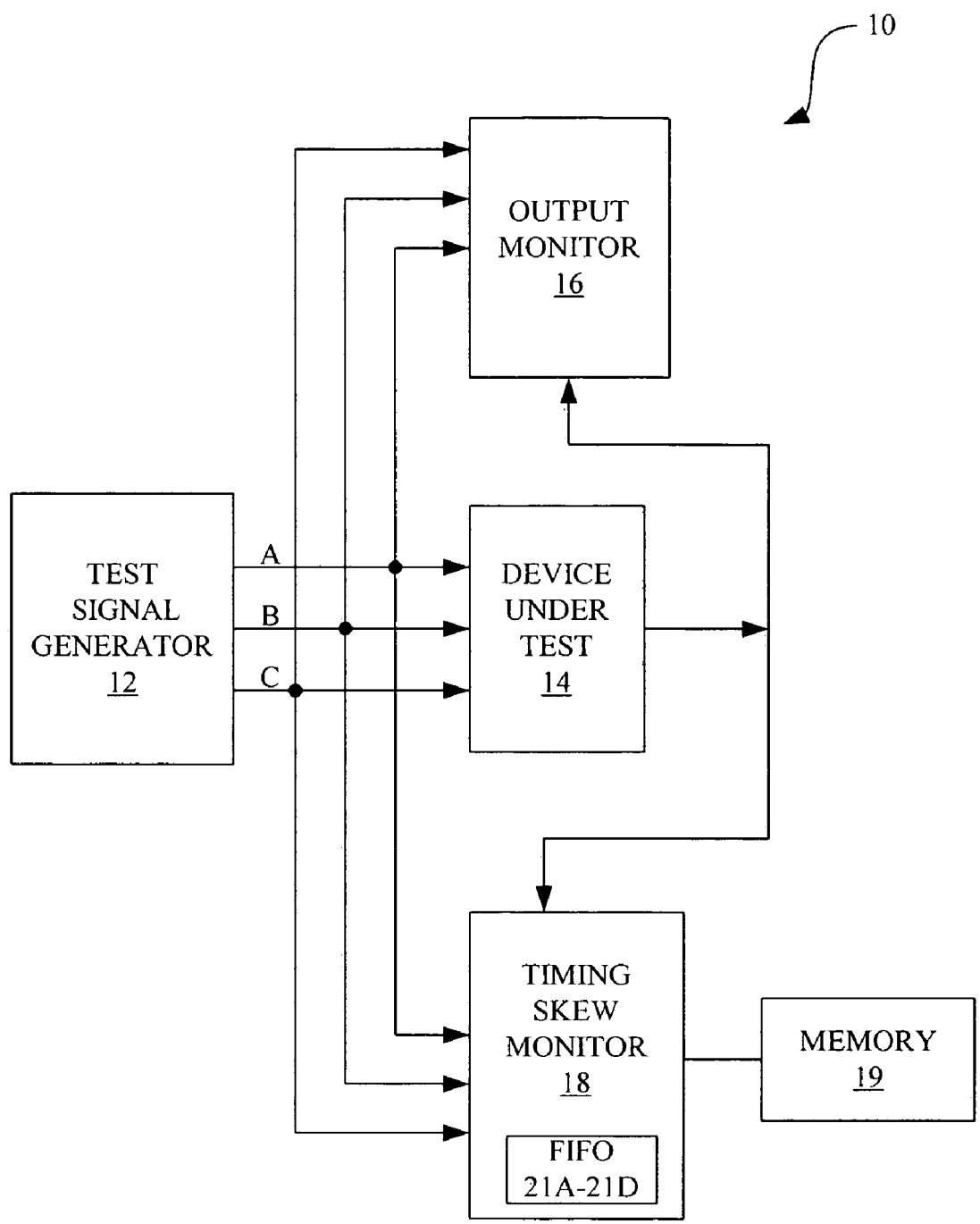
FIG. 1 is a system for testing a device in accordance with one embodiment of the present invention.

Turning now to FIG. 1, a test system 10 in accordance with one embodiment of the present invention includes a test signal generator 12 for supplying a predefined sequence of test signals to a device under test (DUT) 14, an output monitor 16 for checking the proper operation of the DUT, and a timing skew monitor 18 for monitoring the state of the DUT affected by test signals. Each of the test signal generator 12, the output monitor 16 and the timing skew monitor 18 are implemented as software programs that are run in a processor such as, for example, a workstation or PC. The DUT 14 may also be in a form of a software program such as, for example, verilog or vhdl, or it may be represented by real hardware, as in post-silicon testing. User inputs and outputs to the test system 10 are through a user interface (not shown) associated with the processor in which the test system 10 operates.

The test signal generator 12 is a simulation program generated using, in one embodiment, Specman® "e" programming language. However, other programming languages such as, for example, verilog, vhdl, or systemC may also be employed. The test signal generator 12 generates various predefined signal timing combinations that enable the DUT 14 to behave in a predictable way, or perform certain operations, desired by the operator. The test signal generator 12 is programmed to generate at least one signal, since the internal state of the DUT 14 is monitored based on the timing of a signal relative to at least one other signal (including the output signal of the DUT), as explained further below. Accordingly, the test signal generator 12 is configured to generate as many sequences of test signals as the DUT 14 requires (three input test signals A, B, C are shown in FIG. 1 as an example). The selection of the number of test signals to generate and the characteristics of the test signals are based on the test specifications of the DUT 14 or as desired by the operator.

The output monitor 16 is a simulation program such as, for example, Specman® "e" or verilog. The output monitor 16 receives as its inputs the test signals output by the test signal generator 12 and the output signal(s) from the DUT 14. The output monitor 16 compares the actual output signal(s) from the DUT 14 with the signal(s) that should be output based on the input test signals and the knowledge of the design of the DUT. In other words, the output monitor 16 monitors the DUT 14 for its correct operation in accordance with the DUT's design.

The timing skew monitor 18 also receives as its input, test signals that are output by the test signal generator 12 and any output signal(s) from the DUT 14. The timing of receipt of these signals are monitored relative to each other and the results are used as entries to arrays or tables generated by the timing skew monitor 18, and stored in a memory 19 of the timing skew monitor. In one embodiment, the timing skew monitor 18 is provided with FIFOs 21A-21D for receiving test signal sequences A, B and C, and signal D output by the DUT 14.

Figure 2:
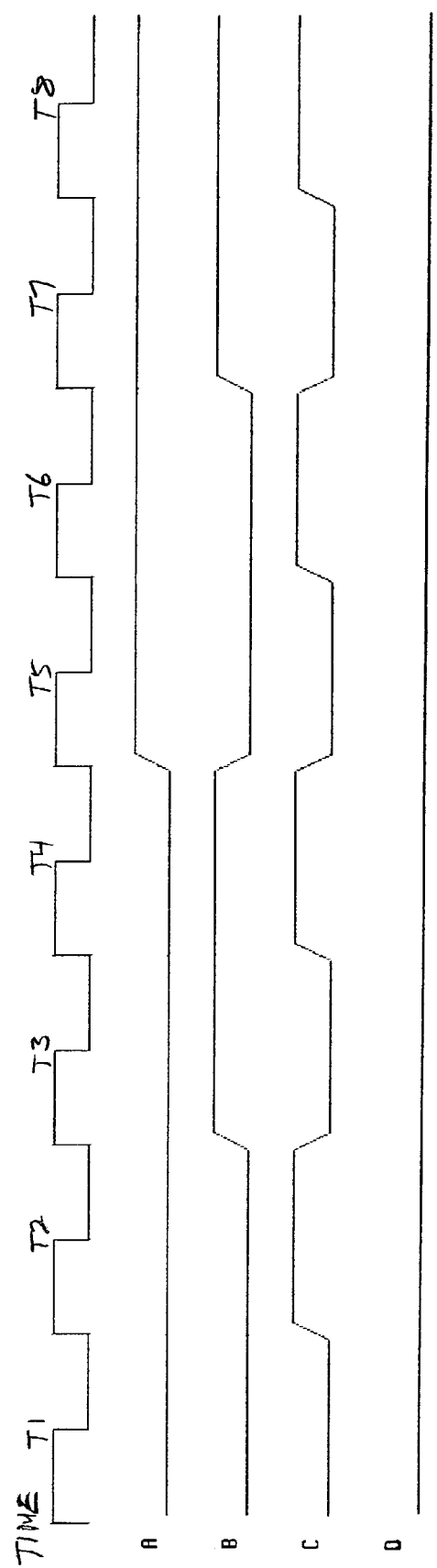
FIG. 2 is a timing chart showing sample test signals that are monitored by a timing skew monitor in the test system of the present invention.
Figures 7, 8:
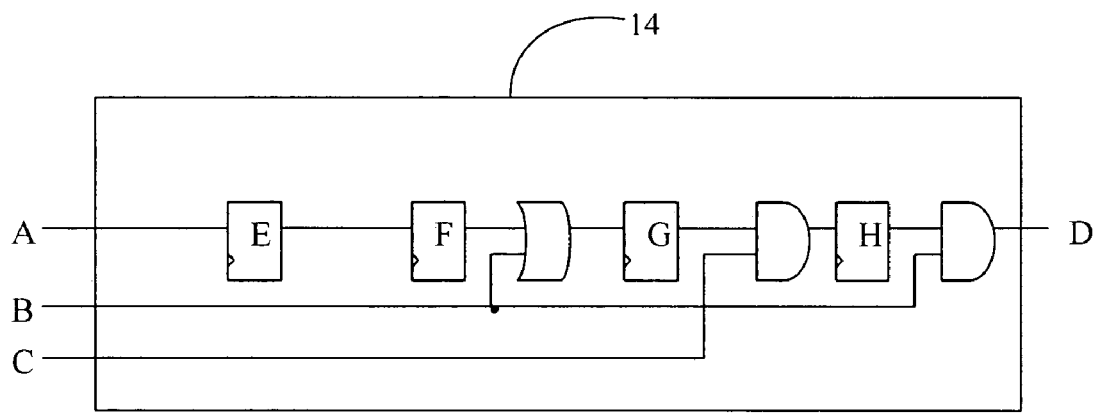
FIG. 7 is a sample device under test.
FIG. 8 is a table showing the input and output signals for analyzing the device under test according to prior art method.

Turning now to FIG. 2, an example of a timing diagram of input test signals A, B and C output by the test signal generator 12 and signal D output by the DUT 14 at time or clock periods T1 to T8 is shown. The DUT 14 is assumed to have the internal circuitry shown in the device of FIG. 7. Examples of arrays created by the timing skew monitor 18 based on test signals A, B, C and output signal D are shown in FIGS. 3-5. An array 20 of FIG. 3 shows the receipt of signals B and C relative to the receipt of signal A, an array 22 of FIG. 4 shows the receipt of signals B and D relative to the receipt of signal A; and an array 24 of FIG. 5 shows the receipt of signals C and D relative to the receipt of signal A, all within nine (9) clock periods.

More specifically, time 0 indicates receipt "1" or non-receipt "0" of two other signals (B and C), (B and D), or (C and D) at the same clock period as the receipt of signal A; times −1, −2, −3 and −4 indicate receipt or non-receipt of two other signals (B and C), (B and D), or (C and D) at 1, 2, 3 and 4 clock periods, respectively, prior to the receipt of signal A; and times +1, +2, +3 and +4 indicate receipt or non-receipt of two other signals (B and C), (B and D), or (C and D) at 1, 2, 3 and 4 clock periods after the receipt of signal A. For example, referring to the array 20 of FIG. 3 and the timing diagram of FIG. 2, an entry of "1" in the block B=−1 and C=−3 indicates that when signal A is received by the timing skew monitor 18, signal B was received at one (1) clock period prior to the receipt of signal A and signal C was received at three (3) clock periods prior to the receipt of signal A. This example corresponds to clock periods T5, T4 and T2 respectively, of the timing diagram of FIG. 2. In other words, when signal A is received by the timing skew monitor 18 at time T5, signal B had been received at T4 and signal C had been received at T2, indicating that the signal combination of A relative to B and C had been executed by the DUT 14.

In another example, and referring still to the array 20 of FIG. 3 and the timing diagram of FIG. 2, an entry of "0" in the block B=−1 and C=+2 indicates that at the time signal A is received by the timing skew monitor 18, either one or both of signals B at one clock period prior to receipt of signal A or signal C at two clock periods after the receipt of A was not received by the timing skew monitor. This example may correspond to periods T5, T4 and T7 of the timing diagram of FIG. 2. In other words, when signal A is received by the timing skew monitor 18 at time T5, signal B had been received at T4, but signal C had not been received at T7. Since both signals B and C had not been received, the entry is "0." Therefore, over the course of the entire test, there was never a cycle when A was "1" and B has been "1" one cycle earlier, and C becomes "1" two cycles later, indicating that this signal combination of A relative to B and C not been executed by the DUT 14.

Arrays 22 and 24 of FIGS. 4 and 5 shows that none of the signal combination of A relative to B and D within 4 clock periods of receipt of A, and the signal combination of A relative to C and D within 4 clock periods of receipt of A, have been executed by the DUT 14. This is because the current test stimulus never causes D to be set to 1. The operator determines whether the results shown in arrays 22 and 24 are relevant in determining proper operation of the DUT 14.

It should be understood that the arrays 20, 22, 24 of FIGS. 3-5, show some signals that are in the future relative to one or the other of the signals (i.e., in FIG. 3, the right half of the array 20 describes future values of B when looking at A, and the bottom half of the array describes future values of C when looking at A). The FIFOs 21A-21D enables the timing skew monitor 28 to obtain the future values for each of the monitored signals A, B, C, D. More specifically, each of FIFOs 21A-21D are 1 bit wide and 9 bits deep. This arrangement allows the timing skew monitor 18 to apply the monitoring at the halfway point through the FIFOs 21A-21D, thus making it possible to look both forward and backward in time when filling out the arrays 20, 22, 24.

Figure 6A:
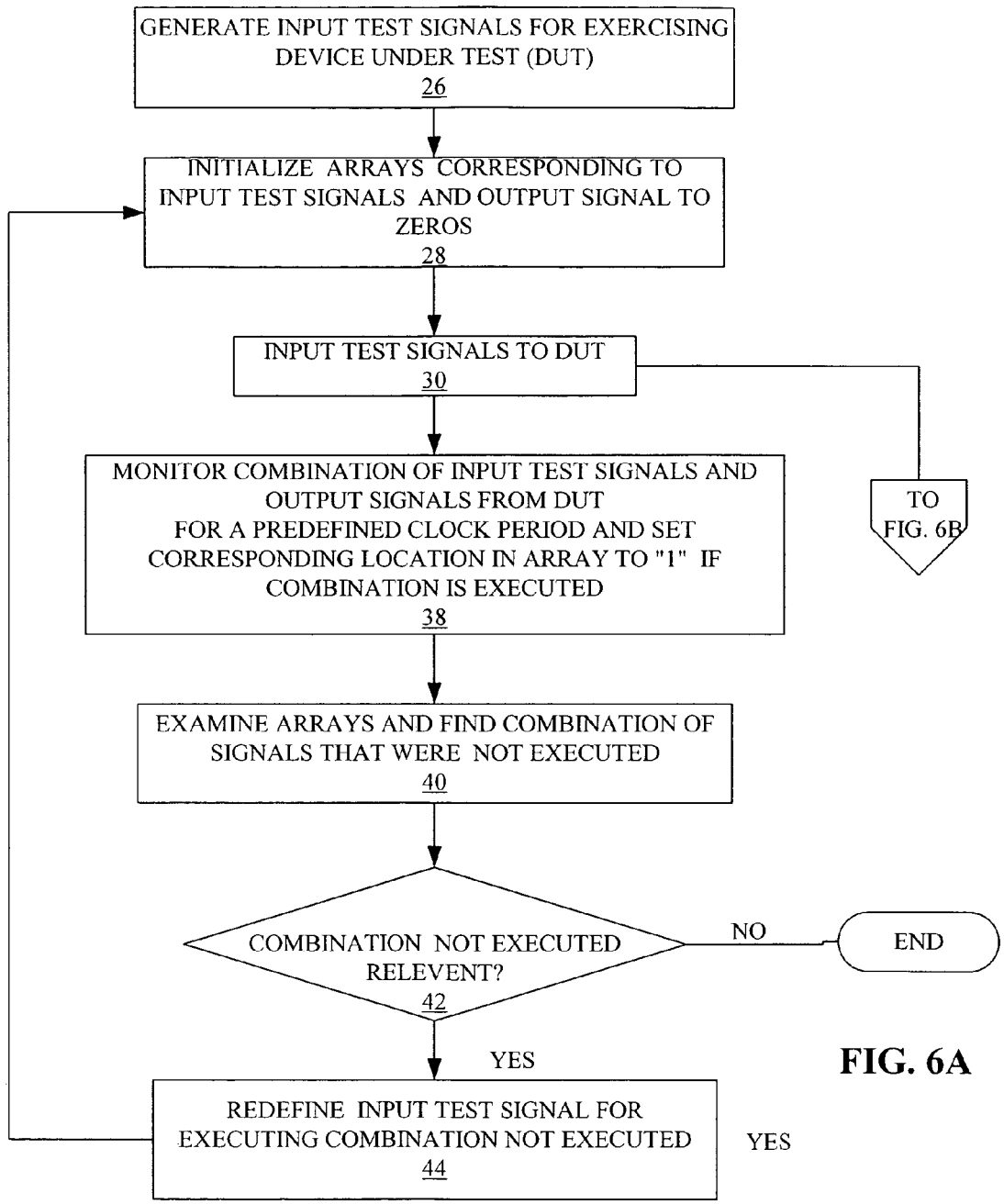
FIGS. 6A and 6B are flowcharts describing the operation of the test system of FIG. 1.
Figure 6B:
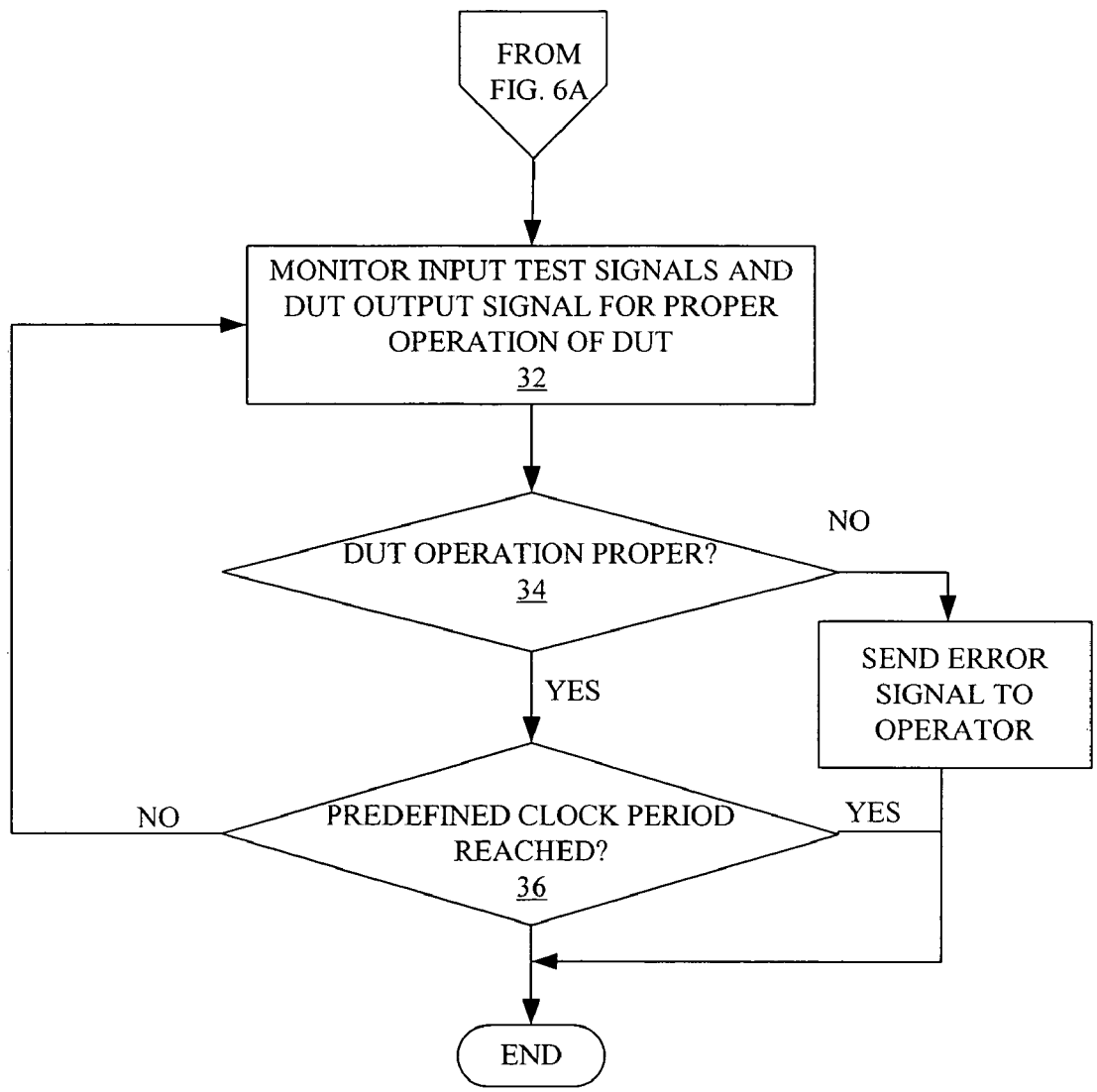

Turning now to FIGS. 6A and 6B, the operation of the test system 10 includes setting the test signal generator 12 to generate the desired sequence of test signals for exercising the DUT 14 (the device shown in FIG. 7 with desired test signals A, B, C are used as an example), i.e., enabling the DUT to perform its designed functions (block 26). The timing skew monitor 18 initializes the arrays 20, 22, 24 having the predefined clock (nine (9) periods) and corresponding to signals A, B, C and D, to all zeros (block 28). Test signals A, B, C are then output by the test signal generator 12 and input to the DUT 14 (block 30).

Test signals A, B, C from the signal generator 12 are also input to the output monitor 16, which along with the output signal D from the DUT 14, monitors the proper operation of the DUT (block 32). If the DUT 14 is operating properly (block 34), the output monitor 16 continues monitoring the signal A, B, C and D until the predefined clock periods has been reached (block 36). If, on the other hand, the DUT 14 is not operating properly, the output monitor 16 sends an error signal to the operator (block 37) and the test comes to an end.

When the test signal generator 12 outputs the signals A, B, C, they are also input to the timing skew monitor 18, which also receives the output signal D as an input. The timing skew monitor 18 monitors these signals for the predefined clock periods (in this example 9 clock periods) and sets the corresponding entry location in the arrays to "1" when both signals of combinations of (B and C), (B and D) or (C and D) are received within the predefined clock periods relative to the receipt of signal A (block 38).

When all of the signal combinations have been monitored for the predefined clock periods, the arrays 20, 22, 24 are examined by the operator to determine whether any of the signal timing combinations have not been executed (block 40), as compared with a predefined or design specification of the DUT. The operator then determines whether the signal timing combinations that have not been executed are relevant to the proper operation of the DUT 14 (block 42). If not, the test ends.

On the other hand, if the operator determines that the signal timing combinations that were not executed are relevant in determining the proper operation of the DUT 14, test signals A, B, C are redefined, (e.g., changing the time periods at which these signals go high) to enable the DUT 14 to execute the signal timing combination not executed (block 44). For example, in the array 20 of FIG. 3, the block B=4, C=3 may be determined by the operator to be important to the operation of the DUT, but not executed by the current tests. In order to accomplish this datapoint, the operator may change the input stimulus by setting signal A high during time T3 (see FIG. 2). This will have the effect of causing signal D to go to "1" during time T7. The process then goes back to block 28, where the arrays 20, 22, 24 corresponding to the redefined test signals A, B, C and signal D from the DUT 12 are initialized to zeros, and the process described above is repeated.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for testing an IC device, comprising:
   generating a plurality of predefined test signals in sequence;
   inputting the test signals into the IC device and a timing skew monitor;
   monitoring the test signals input to the timing skew monitor and an output signal generated by the IC device from the test signals input to the IC device, for a predetermined time period;
   creating an array indicating receipt or nonreceipt of signal timing combinations of one of the test signals and the output signal relative in time prior to and after receipt of at least one of the other test signals and the output signal within said predetermined time period by the timing skew monitor; and
   reviewing the array to determine whether desired signal timing combinations of the test signals have been received by the timing skew monitor.

2. The method as defined in claim 1, wherein said execution of said signal timing combinations occur when one of the test signals is received by the IC device at one time at the predetermined time period and said at least one of the other test signals is also received at the predetermined time period.

3. The method as defined in claim 1, wherein said nonexecution of said signal timing combinations occur when the one of the test signals is received by the IC device at one time at the predetermined time period and said at least one of the other test signals is not received at the predetermined time period.

4. The method as defined in claim 1, further comprising:
   redefining the plurality of predefined test signal sequences and inputting the redefined test signals in the IC device when it is determined from said review of the array that the desired signal combinations of test signal sequences have not been executed by the IC device.

5. The method as defined in claim 1, further comprising:
   inputting the predefined test signals into a device monitoring unit;
   checking the correctness of an operation of the IC device based on the predefined test signals input to the device monitoring unit and an output signal from the IC device.

6. The method as defined in claim 5, wherein said checking the operation of the IC device is performed by a software program run on a processor.

7. The method as defined in claim 1, wherein the predefined test signal sequences are generated by a signal generating program.

8. The method as defined in claim 1, wherein said monitoring of the test signals and the output signal from the IC device, and said creating of the array is performed by a software program run on a processor.

9. An apparatus for testing an IC device, comprising:
   a test signal generator for generating a plurality of predefined test signal sequences input in the IC device; and
   a timing skew monitor for receiving the predefined test signal and an output signal generated by the IC device based on the test signal input to the IC device and the output signal, monitoring the test signals for a predetermined time period, and creating an array indicating receipt or non receipt of signal timing combinations of one of the test signals and the output signal relative in time prior to and after a receipt of at least one of the other test signals and the output signal within the predetermined time period by the timing skew monitor;
   wherein an operator reviews the array to determine whether desired signal timing combinations of test signals have been received by the timing skew monitor.

10. The apparatus as defined in claim 9, wherein said execution of said signal timing combinations occur when the one of the test signals is received by the IC device at one time at the predetermined time period and said at least one of the other test signals is also received at the predetermined time period.

11. The apparatus as defined in claim 9, wherein said nonexecution of said signal timing combinations occur when the one of the test signals is received by the IC device at one time at the predetermined time period and said at least one of the other test signals is not received at the predetermined time period.

12. The apparatus as defined in claim 9, wherein said test signal generator outputs a redefined plurality of predefined test signal sequences to the IC device when it is determined by the operator from the review of said array that the desired signal timing combinations of test signals have not been executed by the IC device.

13. The apparatus as defined in claim 9, further comprising:
   an output monitor for checking the correctness of an operation of the IC device based on the predefined test signals input to the output monitor and an output signal from the IC device.

14. The apparatus as defined in claim 13, wherein said output monitor comprises a software program run on a processor.

15. The apparatus as defined in claim 9, wherein said test signal generator comprises a software program run on a processor.

16. The apparatus as defined in claim 9, wherein said timing skew monitor is a software program run on a processor.

17. The apparatus as defined in claim 16, further comprising a memory for storing said array generated by said timing skew monitor.

18. The apparatus as defined in claim 9, wherein said timing skew monitor receives the test signal sequences from said test signal generator and the signal output from the IC device in a first in, first out arrangement.

* * * * *